(12) United States Patent
Ock et al.

(10) Patent No.: US 11,513,139 B2
(45) Date of Patent: Nov. 29, 2022

(54) BATTERY PACK DIAGNOSIS APPARATUS

(71) Applicant: LG Chem, Ltd., Seoul (KR)

(72) Inventors: Jang-Soo Ock, Daejeon (KR); Yeon-Do Park, Daejeon (KR)

(73) Assignee: LG Energy Solution, Ltd.

( * ) Notice: Subject to any disclaimer, the term of this patent is extended or adjusted under 35 U.S.C. 154(b) by 52 days.

(21) Appl. No.: 17/053,845

(22) PCT Filed: Jan. 10, 2020

(86) PCT No.: PCT/KR2020/000546
§ 371 (c)(1),
(2) Date: Nov. 9, 2020

(87) PCT Pub. No.: WO2020/145768
PCT Pub. Date: Jul. 16, 2020

(65) Prior Publication Data
US 2021/0231707 A1   Jul. 29, 2021

(30) Foreign Application Priority Data
Jan. 11, 2019   (KR) .................. 10-2019-0004160

(51) Int. Cl.
*G01R 19/00* (2006.01)
*G01R 1/20* (2006.01)
(Continued)

(52) U.S. Cl.
CPC ....... *G01R 1/203* (2013.01); *G01R 19/16566* (2013.01); *G01R 31/327* (2013.01);
(Continued)

(58) Field of Classification Search
USPC ................................. 324/126, 426
See application file for complete search history.

(56) References Cited

U.S. PATENT DOCUMENTS

| 2009/0303647 A1 | 12/2009 | Bauer et al. |
| 2011/0104525 A1 | 5/2011 | Kim et al. |

(Continued)

FOREIGN PATENT DOCUMENTS

| JP | H1066251 A | 3/1998 |
| JP | 2005149843 A | 6/2005 |

(Continued)

OTHER PUBLICATIONS

International Search Report for PCT/KR2020/000546 dated Apr. 28, 2020; 3 pages.

(Continued)

*Primary Examiner* — Vincent Q Nguyen
(74) *Attorney, Agent, or Firm* — Lerner, David, Littenberg, Krumholz & Mentlik, LLP

(57) ABSTRACT

An apparatus and method for diagnosing whether a charging and discharging switching element provided on a charging and discharging path of a battery pack operates normally. A charging and discharging switching unit having a charging and discharging switch and a fuse is installed on a charging and discharging path between a battery cell and a pack terminal. The apparatus includes a first diagnosing path a second diagnosing path, a third diagnosing path, an integrated diagnosing path having a diagnosis switching unit and a diagnosis resistor, a voltage measuring unit, and a control unit configured to turn on and off the diagnosis switching unit and determine whether the charging and discharging switching unit is operating abnormally based on the diagnosis voltage measured by the voltage measuring unit.

17 Claims, 9 Drawing Sheets

(51) Int. Cl.
  *G01R 31/74*    (2020.01)
  *G01R 19/165*   (2006.01)
  *G01R 31/327*   (2006.01)
  *H01M 10/42*    (2006.01)
  *H01M 10/48*    (2006.01)
  *H02J 7/00*     (2006.01)

(52) U.S. Cl.
  CPC ........ *G01R 31/74* (2020.01); *H01M 10/4207* (2013.01); *H01M 10/48* (2013.01); *H02J 7/007* (2013.01)

(56) References Cited

U.S. PATENT DOCUMENTS

| | | |
|---|---|---|
| 2013/0320986 A1 | 12/2013 | Shiraishi et al. |
| 2015/0323603 A1 | 11/2015 | Kim et al. |
| 2016/0288651 A1 | 10/2016 | Kinoshita |
| 2016/0301224 A1 | 10/2016 | Kim |
| 2018/0069388 A1 | 3/2018 | Kim |
| 2019/0120878 A1 | 4/2019 | Kim et al. |
| 2019/0229746 A1* | 7/2019 | Taki .................... H03M 1/1245 |

FOREIGN PATENT DOCUMENTS

| | | |
|---|---|---|
| JP | 201436556 A | 2/2014 |
| JP | 5733786 B2 | 6/2015 |
| JP | 2016193634 A | 11/2016 |
| JP | 6385530 B1 | 9/2018 |
| KR | 101222334 B1 | 1/2013 |
| KR | 101292138 B1 | 8/2013 |
| KR | 101489219 B1 | 2/2015 |
| KR | 101551088 B1 | 9/2015 |
| KR | 20160121213 A | 10/2016 |
| KR | 20170024818 A | 3/2017 |
| KR | 20180027897 A | 3/2018 |
| KR | 20180037812 A | 4/2018 |
| KR | 101858321 B1 | 5/2018 |
| WO | 2017148471 A1 | 9/2017 |

OTHER PUBLICATIONS

Extended European Search Report including Written Opinion for Application No. 20739173.1 dated Nov. 12, 2021, pp. 1-7.

* cited by examiner

FIG. 4

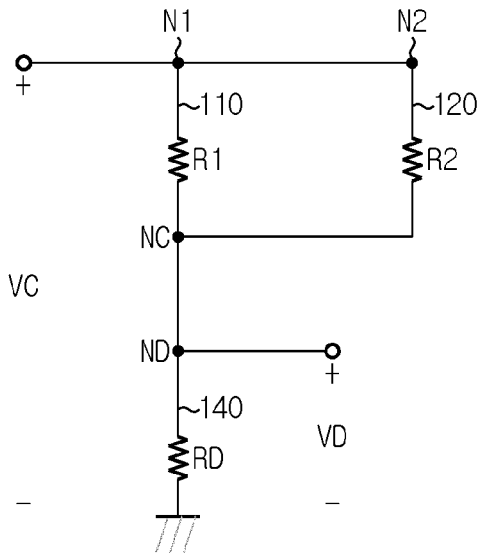

FIG. 5

| REGION | REFERENCE REGION [V] | CHARGING AND DISCHARGING SWITCH IN CLOSED STATE | CHARGING AND DISCHARGING SWITCH IN OPENED STATE |
|---|---|---|---|
| FIRST REGION | 3.5 ~ 4.9 | CHARGING AND DISCHARGING SWITCH NORMAL FUSE NORMAL | CHARGING AND DISCHARGING SWITCH ABNORMAL |
| SECOND REGION | 1.8 ~ 3.4 | CHARGING AND DISCHARGING SWITCH NORMAL FUSE ABNORMAL | CHARGING AND DISCHARGING SWITCH ABNORMAL FUSE ABNORMAL |
| THIRD REGION | 0.5 ~ 1.7 | CHARGING AND DISCHARGING SWITCH ABNORMAL | CHARGING AND DISCHARGING SWITCH NORMAL |

| No. | Resistance of each resistor | | | Situation-specific reference voltage | | | Difference between reference voltages | | |
|---|---|---|---|---|---|---|---|---|---|
| | R1 [kΩ] | R2 [kΩ] | R3 [kΩ] | NORMAL [V] | FUSE ABNORMAL [V] | CONTACTOR ABNORMAL [V] | NORMAL – FUSE ABNORMAL [V] | NORMAL – CONTACTOR ABNORMAL [V] | FUSE ABNORMAL – CONTACTOR ABNORMAL [V] |
| 1 | 3992 | 2994 | 1996 | 4.29 | 2.31 | 0.98 | 1.98 | 3.31 | 1.33 |
| 2 | 1996 | 2994 | 3992 | 4.29 | 3.3 | 1.97 | 0.99 | 2.32 | 1.33 |
| 3 | 2994 | 2994 | 2994 | 3.96 | 2.64 | 1.32 | 1.32 | 2.64 | 1.32 |
| 4 | 3493 | 3493 | 2994 | 3.59 | 2.26 | 1.13 | 1.33 | 2.46 | 1.13 |
| 5 | 3992 | 3992 | 2994 | 3.31 | 1.98 | 0.99 | 1.33 | 2.32 | 0.99 |
| 6 | 1996 | 2994 | 2994 | 4.61 | 3.29 | 1.97 | 1.32 | 2.64 | 1.32 |
| 7 | 3992 | 1996 | 2994 | 4.29 | 2.97 | 0.98 | 1.32 | 3.31 | 1.99 |
| 8 | 2994 | 1996 | 3992 | 4.29 | 3.3 | 1.31 | 0.99 | 2.98 | 1.99 |
| 9 | 3992 | 3992 | 3992 | 2.98 | 1.98 | 0.99 | 1 | 1.99 | 0.99 |
| 10 | 2994 | 2495 | 1996 | 4.87 | 2.89 | 1.31 | 1.98 | 3.56 | 1.58 |
| 11 | 1996 | 2495 | 2994 | 4.87 | 3.55 | 1.97 | 1.32 | 2.9 | 1.58 |
| 12 | 2495 | 2495 | 2495 | 4.74 | 3.16 | 1.58 | 1.58 | 3.16 | 1.58 |
| 13 | 2994 | 1996 | 2495 | 4.87 | 3.29 | 1.31 | 1.58 | 3.56 | 1.98 |

FIG. 10

BATTERY PACK DIAGNOSIS APPARATUS

CROSS-REFERENCE TO RELATED APPLICATIONS

The present application is a national phase entry under 35 U.S.C. § 371 of International Application No. PCT/KR2020/000546 filed Jan. 10, 2020, published in Korean, which claims priority from Korean Patent Application No. 10-2019-0004160 filed Jan. 11, 2019, all of which are incorporated herein by reference.

TECHNICAL FIELD

The present disclosure relates to a technique for diagnosing a battery pack, and more particularly, to a technique for diagnosing whether a charging and discharging switching element provided on a charging and discharging path of the battery pack operates normally.

BACKGROUND ART

Recently, as the demand for portable electronic products such as laptops, video cameras and portable telephones has rapidly increased and storage batteries for energy storage, robots, satellites, or the like have been developed in earnest, high-performance secondary batteries capable of being repeatedly charged and discharged are being actively studied.

Accordingly, as technology development and demand for mobile devices, electric vehicles, hybrid electric vehicles, power storage devices, uninterruptible power supplies, and the like increase, the demand for secondary batteries as an energy source is rapidly increasing. In particular, secondary batteries used in electric vehicles or hybrid electric vehicles are high-power, high-capacity secondary batteries, and many studies are being conducted thereon.

Currently commercialized secondary batteries include nickel-cadmium batteries, nickel-hydrogen batteries, nickel-zinc batteries, lithium secondary batteries, and the like. Among them, the lithium secondary batteries are spotlighted because they ensure free charging and discharging due to substantially no memory effect compared to nickel-based secondary batteries, as well as very low discharge rate and high energy density.

The lithium secondary battery mainly uses lithium-based oxide and carbon material as positive electrode active material and negative electrode active material, respectively. The lithium secondary battery includes an electrode assembly in which a positive electrode plate and a negative electrode plate respectively coated with a positive electrode active material and a negative electrode active material are arranged with a separator interposed therebetween, and an exterior, namely a battery case, for hermetically receiving the electrode assembly together with electrolyte.

At least one secondary battery may be included in a battery pack as a battery cell, and the secondary battery may be charged and discharged through a charging and discharging path to function as a substantial power source for the battery pack. At this time, a charging and discharging switching unit for opening and closing the charging and discharging path may be installed between the secondary battery, namely the battery cell, and a pack terminal of the battery pack. In particular, the charging and discharging switching unit may include a charging and discharging switch and a fuse. The charging and discharging switch is controlled by a control unit provided to the battery pack to turn on and off the charging and discharging path. As the charging and discharging switch, a mechanical switch such as a contactor or an electronic switch such as a MOSFET may be used. In addition, when overcurrent flows in the charging and discharging path, the fuse may be disconnected to irreversibly block the charging and discharging path.

The charging and discharging switch or the fuse is an element that selectively allows a charging and discharging current to flow, while rapidly blocking the flow of current when an abnormal situation occurs, and may be regarded as a very important component in the battery pack. If an abnormality occurs in the charging and discharging switch or the fuse not to properly permit or block the flow of the charging and discharging current, the battery pack may be damaged, and also a device or user connected to the battery pack may be seriously damaged. In particular, in the case of a middle-sized or large-sized battery pack used in devices such as an electric vehicle or an energy storage system (ESS), which have been used more and more in recent years, a very large current may flow in the charging and discharging path. Thus, if the flow of the charging and discharging current is not blocked in time, the battery pack may be damaged, and also the corresponding device may be damaged or ignited. Moreover, in the case of the electric vehicle, most users are riding therein in use, and the electric vehicle moves at a high speed. Thus, if the current is not properly turned on/off, the users may be injured along with material damage.

Therefore, it is necessary to accurately diagnose whether the charging and discharging switch or the fuse is operating normally. In this aspect, various techniques have been proposed for diagnosing whether the charging and discharging switching element such as the charging and discharging switch or the fuse provided to the charging and discharging path of the battery pack operates normally. However, effective techniques for diagnosing the charging and discharging switching element have not been proposed. For example, in the case of conventional diagnostic techniques, a circuit structure or a result calculation process is complicated, which however still have many problems such as difficulty in quick processing, many errors, requirement for a high-performance control device for accurate processing, an uneasy manufacturing process, or high manufacture cost.

SUMMARY

Technical Problem

The present disclosure is designed to solve the problems of the related art, and therefore the present disclosure is directed to providing a battery pack diagnosing apparatus, which may effectively diagnose whether a charging and discharging switching unit provided to a charging and discharging path of a battery pack operates normally, and a battery pack and a vehicle including the battery pack diagnosing apparatus.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery pack diagnosing apparatus in which a charging and discharging switching unit, having (i) a charging and discharging switch and (ii) a fuse, is installed on a charging and discharging path between a battery cell and a pack terminal, the battery pack diagnosing apparatus comprising: a first diagnosing path having a first end connected to a first node between the battery cell and the charging and discharging switching unit and a second end connected to a common node on a path toward ground, the first diagnosing path having a first resistor; a second diagnosing path having a first end connected to a second node between the charging and discharging switch and the fuse and a second end connected to the common node, the second diagnosing path having a second resistor; a third diagnosing path having a first end connected to a third node between the charging and discharging switching unit and the pack terminal and a second end connected to the common node, the third diagnosing path having a third resistor; an integrated diagnosing path having a first end connected to the common node and a second end connected to ground, the integrated diagnosing path having a diagnosis switching unit and a diagnosis resistor; a voltage measuring unit configured to measure a diagnosis voltage between the diagnosis switching unit and the diagnosis resistor; and a control unit configured to turn on and off the diagnosis switching unit and determine whether the charging and discharging switching unit is operating abnormally based on the diagnosis voltage measured by the voltage measuring unit.

Here, the first diagnosing path, the second diagnosing path and the third diagnosing path may have no switching element.

In addition, the control unit may be configured to determine which of the charging and discharging switch and the fuse is operating abnormally.

In addition, the battery pack diagnosing apparatus according to the present disclosure may further comprise a memory unit configured to store a reference voltage for comparison with the measured diagnosis voltage.

In addition, the first diagnosing path may have a diode configured to allow current to flow from the first node toward the common node and restrict current from flowing from the common node toward the first node.

In addition, the second diagnosing path may have a first diode configured to allow current to flow from the second node toward the common node and restrict current from flowing from the common node toward the second node, and the third diagnosing path may have a second diode configured to allow current to flow from the third node toward the common node and restrict current from flowing from the common node toward the third node.

In addition, the second diagnosing path and the third diagnosing path may have a common path at least partially integrating a portion of the second diagnosing path between the second resistor and the common node and a portion of the third diagnosing path between the third resistor and the common node, and wherein the common path has a diode configured to allow current to flow from the second and third nodes toward the common node and restrict current from flowing from the common node toward the second and third nodes.

In addition, at least two resistors among the first resistor, the second resistor and the third resistor may have different resistances.

In addition, in another aspect of the present disclosure, there is also provided a battery pack, comprising the battery pack diagnosing apparatus according to any of the embodiments of the present disclosure.

In addition, in another aspect of the present disclosure, there is also provided a vehicle, comprising the battery pack diagnosing apparatus according to any of the embodiments of the present disclosure.

Another aspect of the disclosure is directed to a method for diagnosing a battery pack in which a charging and discharging switching unit, having a (i) charging and discharging switch and (ii) a fuse, is installed on a charging and discharging path between a battery cell and a pack terminal. The method includes measuring, by a voltage measuring unit, a diagnosis voltage between a diagnosis switching unit and a diagnosis resistor on an integrated diagnosing path having a first end connected to the common node and a second end connected to ground, wherein the common node is connected to each of (i) a first node between the battery cell and the charging and discharging switching unit via a first diagnosing path having a first resistor, (ii) a second node between the charging and discharging switch and the fuse via a second diagnosing path having a second resistor, and (iii) a third node between the charging and discharging switching unit and the pack terminal via a third diagnosing path having a third resistor, and determining, by a control unit configured to turn the diagnosis switching unit on and off, whether the charging and discharging switching unit is operating abnormally based on the diagnosis voltage measured by the voltage measuring unit.

In addition, determining whether the charging and discharging switching unit is operating abnormally may include determining which of the charging and discharging switch and the fuse is operating abnormally.

In addition, the method may include comparing, by the control unit, the measured diagnosis voltage with a reference voltage stored in a memory unit, wherein determining whether the charging and discharging switching unit is operating abnormally may be based on comparison of the measured diagnosis voltage with the reference voltage.

In addition, the first diagnosing path may have a diode allowing current to flow from the first node toward the common node and restricting current from flowing from the common node toward the first node.

In addition, the second diagnosing path may have a first diode allowing current to flow from the second node toward the common node and restricting current from flowing from the common node toward the second node, and the third diagnosing path may have a second diode allowing current to flow from the third node toward the common node and restricting current from flowing from the common node toward the third node.

In addition, the second diagnosing path and the third diagnosing path may have a common path at least partially integrating a portion of the second diagnosing path between the second resistor and the common node and a portion of the third diagnosing path between the third resistor and the common node, and the common path may have a diode allowing current to flow from the second and third nodes toward the common node and restricting current from flowing from the common node toward the second and third nodes.

In addition, at least two resistors among the first resistor, the second resistor and the third resistor may have different resistances.

Advantageous Effects

According to an embodiment of the present disclosure, it is possible to effectively diagnose whether the charging and discharging switching unit, particularly the charging and discharging switch and the fuse, installed to the charging and discharging path of the battery pack operates normally.

In particular, according to an embodiment of the present disclosure, it is possible to accurately diagnose whether the charging and discharging switching unit is abnormal even with a simple circuit configuration.

Moreover, according to an embodiment of the present disclosure, only one switching element may be provided, and it is possible to diagnose whether the charging and discharging switching unit is abnormal by controlling the switching element. Thus, the control configuration for the switching element is simplified, the diagnostic error of the charging and discharging switching unit is reduced, and a quick diagnosis may be possible.

In addition, according to an embodiment of the present disclosure, the number of resistors for diagnosing whether the charging and discharging switching unit is abnormal may be reduced. Thus, the circuit configuration is simplified, thereby facilitating the manufacture of the battery pack diagnosing apparatus and improving the productivity.

Other effects of the present disclosure may be further mentioned or deduced from the following detailed descriptions.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

FIG. 4 is a diagram schematically showing a circuit configuration in a state where a fuse is disconnected, in the battery pack diagnosing apparatus of FIG. 1.

FIG. 5 is a diagram showing an example of data stored in a memory unit, in the battery pack diagnosing apparatus according to an embodiment of the present disclosure.

FIG. 10 is a table schematically showing the change in difference between reference voltages of each situation according to the change of resistance magnitude of various resistors, for the battery pack diagnosing apparatus of FIG. 8.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
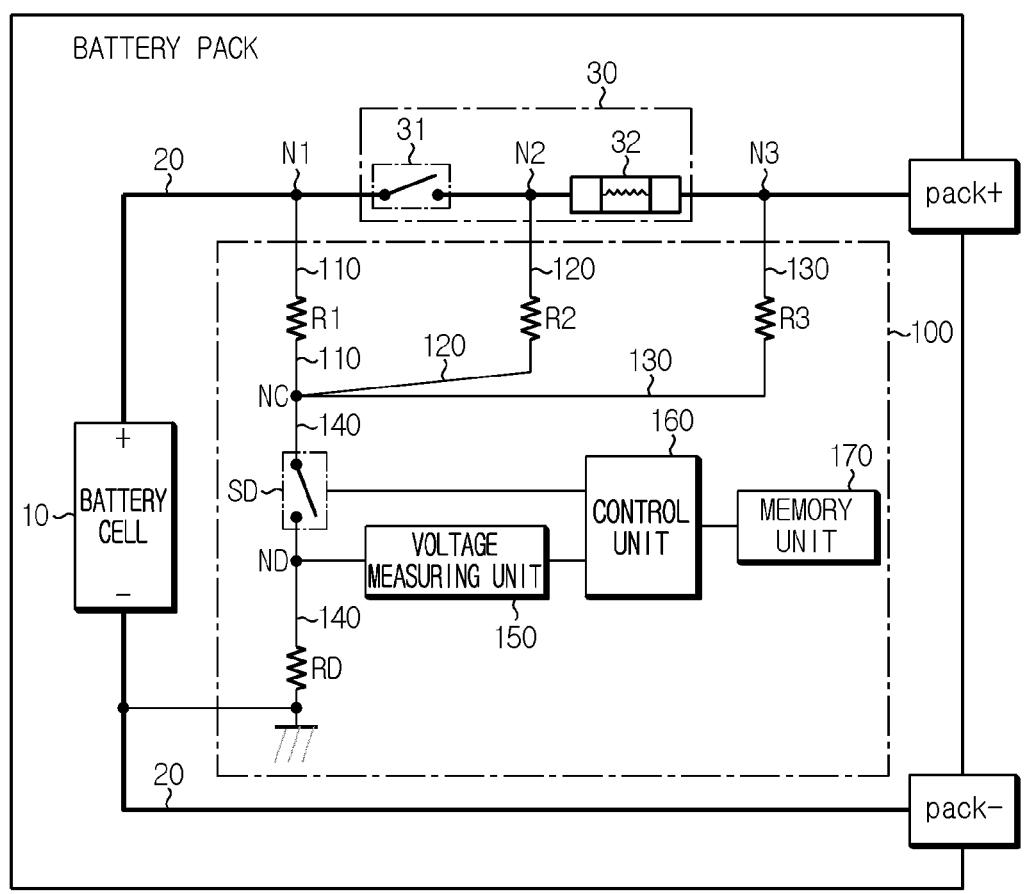
FIG. 1 is a diagram schematically showing a configuration in which a battery pack diagnosing apparatus according to an embodiment of the present disclosure is provided to a battery pack.

FIG. 1 is a diagram schematically showing a configuration in which a battery pack diagnosing apparatus according to an embodiment of the present disclosure is provided to a battery pack.

Referring to FIG. 1, a battery pack diagnosing apparatus 100 according to the present disclosure may be provided to a battery pack. Here, the battery pack may include a battery cell 10, a charging and discharging path 20 and a charging and discharging switching unit 30 together.

The battery cell 10 may include one or more secondary batteries. If a plurality of secondary batteries is included in the battery cell 10, the plurality of secondary batteries may be connected in series and/or in parallel. The charging and discharging path 20 may be located between the battery cell 10, particularly a terminal of the battery cell 10, and a pack terminal (Pack+, Pack−) to allow a charging current for charging the battery cell 10 and a discharging current for discharging the battery cell 10 to flow therethrough. A charging and discharging switching unit 30 capable of opening and closing the flow of the charging and discharging current may be installed at the charging and discharging path 20. Here, the charging and discharging switching unit 30 may include a charging and discharging switch 31 and a fuse 32. In particular, the charging and discharging switch 31 may include a switching element such as a contactor, a relay or a FET. The battery cell 10, the charging and discharging path 20 and the charging and discharging switching unit 30 are well known at the time of filing of this application and thus will not be described in detail here.

The battery pack diagnosing apparatus 100 according to the present disclosure may include a first diagnosing path 110, a second diagnosing path 120, a third diagnosing path 130, an integrated diagnosing path 140, a voltage measuring unit 150 and a control unit 160.

The first diagnosing path 110 may have one end connected between the battery cell 10 and the charging and discharging switching unit 30. For example, as shown in FIG. 1, the first diagnosing path 110 may be connected to a first node N1 that is a point between the battery cell 10 and the charging and discharging switching unit 30. Moreover, in the embodiment of FIG. 1, the charging and discharging switching unit 30 is directly connected to the battery cell 10 and the pack terminal (Pack+, Pack-) and is configured such that the charging and discharging switch 31 and the fuse 32 are directly connected to each other. In particular, in the embodiment of FIG. 1, the charging and discharging switch 31 is configured to be located closer to the battery cell 10 than the fuse 32. In this case, one end of the first diagnosing path 110 may be regarded as being connected to a direct connection path between a positive electrode terminal of the battery cell 10 and a negative electrode terminal (a left terminal in the figure) of the charging and discharging switch 31.

In addition, the first diagnosing path 110 may be configured such that the other end faces the ground. More specifically, the other end of the first diagnosing path 110 may be connected to a node on a path toward the ground. Here, the node to which the other end of the first diagnosing path 110 is connected may be commonly connected to the second diagnosing path 120 and the third diagnosing path 130, explained later. Thus, this node may be referred to as a common node NC. In this case, the other end of the first diagnosing path 110 may be regarded as being connected to the common node NC. In particular, the integrated diagnosing path 140 may be provided to a path at which the first diagnosing path 110 is directed to the ground. Thus, the other end of the first diagnosing path 110 may be regarded as being connected to the integrated diagnosing path 140.

In addition, the first diagnosing path 110 may include a first resistor R1. Here, the first resistor R1 may include one or more resistor elements.

The second diagnosing path 120 may have one end connected to the charging and discharging switching unit 30. In particular, one end of the second diagnosing path 120 may be connected between the charging and discharging switch 31 and the fuse 32. For example, as shown in FIG. 1, the second diagnosing path 120 may be connected to a second node N2 that is a point between the charging and discharging switch 31 and the fuse 32. In particular, in the embodiment of FIG. 1, the charging and discharging switch 31 and the fuse 32 are sequentially positioned from the battery cell 10 toward a positive electrode pack terminal (Pack+). In this case, one end of the second diagnosing path 120 may be regarded as being connected to a direct connection path between a positive electrode terminal (a right terminal in the figure) of the charging and discharging switch 31 and a negative electrode terminal (a left terminal in the figure) of the fuse 32.

In addition, like the first diagnosing path 110, the second diagnosing path 120 may be configured such that the other end faces the ground. More specifically, the other end of the second diagnosing path 120 may be connected to a common node NC to which the other end of the first diagnosing path 110 is connected.

Also, the second diagnosing path 120 may include a second resistor R2. Here, the second resistor R2 may include one or more resistor elements.

The third diagnosing path 130 may have one end connected between the charging and discharging switching unit 30 and the pack terminal. For example, as shown in FIG. 1, the third diagnosing path 130 may be connected to a third node N3 that is a point between the charging and discharging switching unit 30 and the positive electrode pack terminal (Pack+). In particular, in the embodiment of FIG. 1, in the charging and discharging switching unit 30, the fuse 32 is located closer to the pack terminal than the charging and discharging switch 31. In this case, one end of the third diagnosing path 130 may be regarded as being connected between the positive electrode terminal (the right terminal in the figure) of the charging and discharging switch 31 and the positive electrode pack terminal (Pack+).

In addition, like the first diagnosing path 110 and the second diagnosing path 120, the third diagnosing path 130 may be configured such that the other end faces the ground. More specifically, the other end of the third diagnosing path 130 may be connected to the common node NC to which the other end of the first diagnosing path 110 and the other end of the second diagnosing path 120 are connected.

Also, the third diagnosing path 130 may include a third resistor R3. Here, the third resistor R3 may include one or more resistor elements.

The integrated diagnosing path 140 may have one end connected to the common node NC. That is, the integrated diagnosing path 140 may be connected to the other end of the first diagnosing path 110, the other end of the second diagnosing path 120 and the other end of the third diagnosing path 130 through the common node NC. According to this configuration, it may be regarded that the first diagnosing path 110, the second diagnosing path 120 and the third diagnosing path 130 are integrated into one line called the integrated diagnosing path 140 and face the ground.

Also, the other end of the integrated diagnosing path 140 may be connected to the ground. That is, the other end of the integrated diagnosing path 140 may be directly connected to the ground so that the first diagnosing path 110, the second diagnosing path 120 and the third diagnosing path 130 are grounded via the integrated diagnosing path 140.

In addition, the integrated diagnosing path 140 may include a diagnosis switching unit SD and a diagnosis resistor RD. For example, the integrated diagnosing path 140 may be configured such that the diagnosis switching unit SD is located close to the common node NC and the diagnosis resistor RD is located close to the ground.

Here, the diagnosis switching unit SD may selectively turn the integrated diagnosing path 140 on and off. In particular, the diagnosis switching unit SD may have only one switching element. Also, the diagnosis resistor RD may include one or more resistance elements.

The first diagnosing path 110, the second diagnosing path 120, the third diagnosing path 130 and the integrated diagnosing path 140 may be implemented in various current path types known at the time of filing of this application. For example, these paths may be implemented as a conductor pattern on a printed circuit board (PCB) substrate. Alternatively, these paths may be implemented by electric wires. The present disclosure is not limited to a specific form of each path.

The voltage measuring unit 150 may measure a diagnosis voltage. In particular, referring to FIG. 1, the voltage measuring unit 150 may be connected to a diagnosis node ND that is a node between the diagnosis switching unit SD and the diagnosis resistor RD on the integrated diagnosing path 140. In addition, the voltage measuring unit 150 may measure a voltage of the diagnosis node ND, namely a voltage between the diagnosis switching unit SD and the diagnosis resistor RD, as the diagnosis voltage. Here, since the diagnosis resistor RD is directly connected to the ground, the voltage measuring unit 150 may measure a voltage of both terminals of the diagnosis resistor RD as the diagnosis voltage. The diagnosis resistor RD may transmit the measured diagnosis voltage to the control unit 160. The voltage measuring unit 150 may be implemented to include various voltage sensors known at the time of filing of this application.

The control unit 160 may be configured to turn on and off the diagnosis switching unit SD. For example, if the control unit 160 turns on the diagnosis switching unit SD, a current may flow to the integrated diagnosing path 140. Further, if the control unit 160 turns on the diagnosis switching unit SD, a current may flow to the first diagnosing path 110, the second diagnosing path 120 and/or the third diagnosing path 130. In this case, since a voltage is applied to the diagnosis resistor RD, the voltage measuring unit 150 may measure the voltage of the diagnosis resistor RD as the diagnosis voltage. Meanwhile, if the control unit 160 does not turn on the diagnosis switching unit SD, no current flows to the integrated diagnosing path 140, and thus no voltage is applied to the diagnosis resistor RD. Thus, if it is intended to diagnose the state of the charging and discharging switching unit 30, the control unit 160 may turn on the diagnosis switching unit SD.

Also, the control unit 160 may determine whether the charging and discharging switching unit 30 is abnormal. In particular, the control unit 160 may determine whether the charging and discharging switching unit 30 is abnormal based on the diagnosis voltage. Here, the diagnosis voltage may be measured by the voltage measuring unit 150 and provided to the control unit 160.

According to the configuration of the present invention, particularly the circuit configuration as shown in FIG. 1, it is possible to diagnose whether the charging and discharging switching unit 30 of the battery pack, for example the charging and discharging switch 31 such as a contactor and/or the fuse 32, are abnormal just with a simple circuit configuration. Thus, it is easy to manufacture the battery pack diagnosing apparatus 100, and errors may be reduced during diagnosis. In addition, in this case, the volume or weight of the battery pack diagnosing apparatus 100 may be reduced.

The control unit 160 may be implemented using a battery management system, commonly called BMS. In this case, the control unit 160 may be implemented to be included in a battery (or, a battery pack). Alternatively, at least a part of the control unit 160 may be located outside the battery. For example, the control unit 160 may be implemented using a control device mounted in a vehicle, for example an electronic control unit (ECU).

Preferably, the control unit 160 may compare the diagnosis voltage with a reference voltage. In addition, if the diagnosis voltage is different from the reference voltage, the control unit 160 may diagnose that the charging and discharging switching unit 30 is abnormal. Here, if the diagnosis voltage is out of an error range from the reference voltage, the control unit 160 may diagnose that the charging and discharging switching unit 30 is abnormal. Alternatively, by configuring the reference voltage in the form of a predetermined range, the control unit 160 may diagnose that the charging and discharging switching unit 30 is abnormal when the diagnosis voltage is not included within the range of the reference voltage but deviates therefrom.

The control unit 160 may determine whether the charging and discharging switch 31 is turned on or off properly. At this time, the control unit 160 may directly figure out this situation by directly turning on and off the charging and discharging switch 31. Alternatively, the control unit 160 may receive information about whether the charging and discharging switch 31 is turned on or off from another control device.

The control unit 160 may determine whether the charging and discharging switch 31 is properly opened in a situation where the charging and discharging switch 31 must be turned off.

For example, if the control unit 160 sends a turn-off signal directly to the charging and discharging switch 31 or receives information indicating that a turn-off signal for the charging and discharging switch 31 is transmitted from another control device, the control unit 160 may turn on (close) the diagnosis switching unit SD. In addition, the control unit 160 may control the voltage measuring unit 150 to measure the diagnosis voltage and receive the measured value. The control unit 160 may determine whether the charging and discharging switch 31 is properly turned off by using the measured value of the diagnosis voltage received as described above.

Here, the control unit 160 may determine whether the charging and discharging switch 31 is properly turned off by comparing the diagnosis voltage measured by the voltage measuring unit 150 with the reference voltage. This will be described in more detail with reference to FIG. 2.

Figure 2:
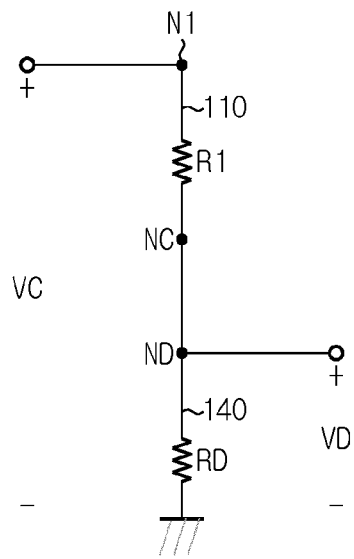
FIG. 2 is a diagram schematically showing a circuit configuration in a state where a charging and discharging switch is normally turned off, in the battery pack diagnosing apparatus of FIG. 1.

FIG. 2 is a diagram schematically showing a circuit configuration in a state where the charging and discharging switch 31 is normally turned off, in the battery pack diagnosing apparatus 100 of FIG. 1. In FIG. 2, VC refers to a voltage of the battery cell 10, and VD refers to a both-terminal voltage of the diagnosis resistor RD.

Referring to FIGS. 1 and 2, since the charging and discharging switch 31 located at the right side of the first node N1 is turned off, a current flows only to the first diagnosing path 110 and no current flows to the second diagnosing path 120 and the third diagnosing path 130. Thus, the first diagnosing path 110 and the integrated diagnosing path 140 may constitute one line connected to each other. That is, the current flowing to the first diagnosing path 110 may be regarded as the same as the current flowing to the integrated diagnosing path 140. In addition, since the diagnosis switching unit SD is turned on, the common node NC and the diagnosis node ND may have the same voltage.

In this configuration, a normal value of diagnosis voltage may be calculated as Equation 1 below.

$$VD = \frac{RD}{(R1 + RD)} VC \qquad \text{(Equation 1)}$$

Here, VD refers to a diagnosis voltage, VC refers to a battery cell voltage, R1 refers to a resistance of the first resistor, and RD refers to a resistance of the diagnosis resistor, respectively.

For example, assuming that the voltage VC of the battery cell is 400 V, the resistance R1 of the first resistor is 4000 kΩ and the resistance RD of the diagnosis resistor is 10 kΩ, if they are put into Equation 1, the following equation may be obtained.

$$VD = (10/(4000+10)) \times 400 = 0.998 \text{ [V]}$$

Thus, in this case, the reference voltage of the diagnosis voltage may be set as about 1 V in a state where the charging and discharging switch 31 is open.

At this time, the control unit 160 may compare the reference voltage (1V) with the diagnosis voltage measured by the voltage measuring unit 150. If the measured value of the diagnosis voltage is identical or similar to the reference voltage (1V), the control unit 160 may determine that the charging and discharging switch 31 is turned off normally.

Meanwhile, if the measured value of the diagnosis voltage is different over a certain level from the reference voltage (1V), the control unit 160 may determine that the charging and discharging switch 31 is not normally turned off.

In the case where a load, for example a motor of an electric vehicle, is connected to the pack terminal (Pack+, Pack−) of the battery pack, if the charging and discharging switch 31 is turned on, a current may flow to the charging and discharging path 20. At this time, due to the resistance components of the first resistor R1, the second resistor R2 and the third resistor R3, a current may not flow to the first diagnosing path 110, the second diagnosing path 120 and the third diagnosing path 130. Thus, even though the diagnosis switching unit SD is turned on, since a current does not flow to the integrated diagnosing path 140, the diagnosis voltage may not be measured by the voltage measuring unit 150. Therefore, if the diagnosis voltage measured by the voltage measuring unit 150 is 0 V or close thereto, the control unit 160 may determine that the charging and discharging switch 31 is not normally turned off. In this case, the control unit 160 may perform related operations such that other switching elements provided in the battery pack are blocked, or provide relevant facts to other devices or users outside the battery pack so that appropriate measures may be taken thereto. For example, if the battery pack is mounted to a vehicle, the control unit 160 may transmit the corresponding fact to an electronic control unit (ECU) of the vehicle. If so, the ECU may turn off the switching element located on the charging and discharging path 20 outside the battery pack so that the charging and discharging current does not flow. Further, if the diagnosis voltage measured value is near 0V, the control unit 160 may also detect that a load is connected to the pack terminal (Pack+, Pack−) of the battery pack.

In the case where a load is not connected to the pack terminal (Pack+, Pack−) of the battery pack, if the diagnosis switching unit SD is closed, the current supplied from the battery cell 10 may flow not only to the first diagnosing path 110 but also to the second diagnosing path 120 and third diagnosing path 130, and then be integrated and flowed to the integrated diagnosing path 140. In this case, since the resistance component between the first node N1 and the common node NC is changed due to the parallel connection component of the first resistor R1, the second resistor R2 and the third resistor R3, the voltage value of the diagnosis voltage may be changed, compared to the case where only the first resistor R1 is present. That is, since the measured value of the diagnosis voltage becomes different from the reference voltage, the control unit 160 may determine that the charging and discharging switch 31 is not properly turned off.

In addition, the control unit 160 may determine whether the charging and discharging switch 31 is properly closed in a situation where the charging and discharging switch 31 must be turned on.

For example, when sending a turn-on signal directly to the charging and discharging switch 31 or receiving information indicating that a turn-on signal for the charging and discharging switch 31 is transmitted from another control unit, the control unit 160 may turn on the diagnosis switching unit SD. In addition, the control unit 160 may control the voltage measuring unit 150 to measure a diagnosis voltage and receive the measured value. The control unit 160 may determine whether the charging and discharging switch 31 is properly turned on by using the measured value of the diagnosis voltage received as above.

Here, the control unit 160 may determine whether the charging and discharging switch 31 is properly turned on by comparing the diagnosis voltage measured by the voltage measuring unit 150 with the reference voltage. This will be described in more detail with reference to FIG. 3 along with FIGS. 1 and 2.

Figure 3:
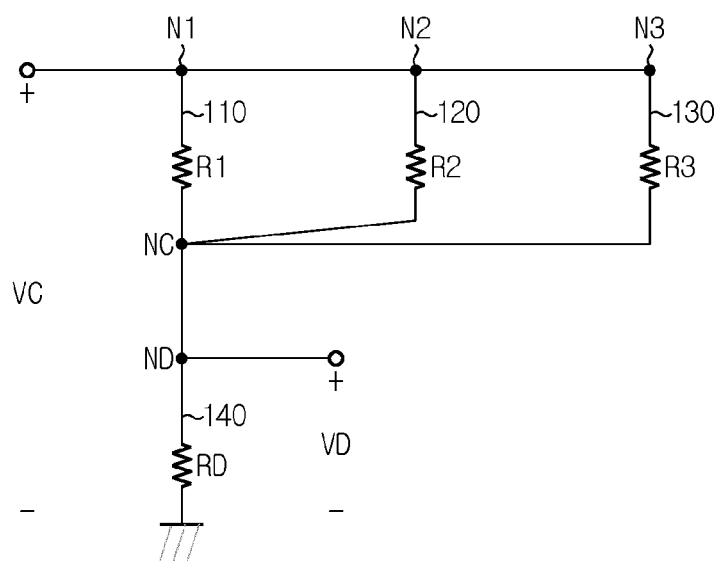
FIG. 3 is a diagram schematically showing a circuit configuration in a state where the charging and discharging switch is normally turned on, in the battery pack diagnosing apparatus of FIG. 1.

FIG. 3 is a diagram schematically showing a circuit configuration in a state where the charging and discharging switch 31 is normally turned on, in the battery pack diagnosing apparatus 100 of FIG. 1.

Referring to FIGS. 1 and 3, if the load is not connected to the pack terminal (Pack+, Pack−) of the battery pack in a state where the charging and discharging switch 31 is normally turned on, seeing the resistor configuration, three resistors R1, R2, R3 may be connected in parallel between the first node N1 and the common node NC. In addition, one RD resistor is present between the common node NC and the ground.

In this configuration, a normal value of diagnosis voltage may be calculated as in Equation 2 below.

$$VD = \frac{RD}{\frac{R1 R2 R3}{(R2R3 + R1R3 + R1R2)} + RD} VC \quad \text{(Equation 2)}$$

Here, VD refers to a diagnosis voltage, VC refers to a battery cell voltage, R1 refers to a resistance of the first resistor, R2 refers to a resistance of the second resistor, R3 refers to a resistance of the third resistor, and RD refers to a resistance of the diagnosis resistor, respectively.

For example, assuming the voltage VC of the battery cell is 400 V, the resistance R1 of the first resistor is 4000 kΩ, the resistance R2 of the second resistor is 3000 kΩ, the resistance R3 of the third resistor is 2000 kΩ and the resistance RD of the diagnosis resistor is 10 kΩ, if they are put into Equation 2, the following equation may be obtained.

$$VD = \frac{10}{\frac{4000 \times 3000 \times 2000}{(3000 \times 2000 + 4000 \times 2000 + 4000 \times 3000)} + 10} \times 400$$

Accordingly, VD=4.287 [V] may be calculated, and the reference voltage of the diagnosis voltage may be set as approximately 4.29 V in a state where the charging and discharging switch 31 is closed.

At this time, the control unit 160 may compare the reference voltage (4.29V) with the diagnosis voltage measured by the voltage measuring unit 150. If the measured value of the diagnosis voltage is identical or similar to the reference voltage (4.29V), the control unit 160 may determine that the charging and discharging switch 31 is normally turned on.

Meanwhile, if the measured value of the diagnosis voltage shows a difference over a certain level from the reference voltage (4.29V), the control unit 160 may determine that the charging and discharging switch 31 is not turned on normally. In particular, if the charging and discharging switch 31 is not properly turned on, as shown in FIG. 2, circuit may flow only to the first diagnosing path 110. Thus, if the resistance of each resistor and the cell voltage are the same as described in the embodiment of FIG. 2, the diagnosis voltage may be measured as approximately 1 V. Thus, if the diagnosis voltage measured by the voltage measuring unit 150 is near 1 V, the control unit 160 may diagnose that the charging and discharging switch 31 is not properly turned on in a situation where the charging and discharging switch 31 must be turned on.

As described above, the battery pack diagnosing apparatus 100 according to an aspect of the present disclosure may easily figure out whether the charging and discharging switch 31 is operating normally just with a simple circuit configuration and simple operation. Moreover, the present disclosure may be advantageous to reduce the number of circuit components such as resistor elements.

In particular, according to an embodiment of the present disclosure, as shown in FIG. 1, the first diagnosing path 110, the second diagnosing path 120 and the third diagnosing path 130 may have no switching element. That is, it may be determined whether the charging and discharging switching unit 30 such as the charging and discharging switch 31 is abnormal just by performing the on/off control on the diagnosis switching unit SD provided to the integrated diagnosing path 140. In addition, the first diagnosing path 110, the second diagnosing path 120 and the third diagnosing path 130 need not have a separate switching element for opening or closing the flow of current.

Thus, according to this configuration of the present disclosure, a component called a switching element may be reduced, thereby saving costs. In addition, in this case, since the circuit configuration is not complicated but simple, productivity of the battery pack diagnosing apparatus 100 may be improved, volume and weight may be reduced, and a defect rate may be lowered. In addition, in this case, since it is not necessary to control several switching elements, it is possible to prevent consumption of resources required for controlling the switching elements, such as CPU performance, memory capacity, and power.

Also preferably, the control unit 160 may determine which component is abnormal among the charging and discharging switch 31 and the fuse 32. That is, the charging and discharging switching unit 30 provided to the charging and discharging path 20 of the battery pack may include a plurality of components, particularly the charging and discharging switch 31 and the fuse 32, together, and the control unit 160 may figure out which component has a problem among the components.

First, an embodiment of the configuration for determining whether the charging and discharging switch 31 is abnormal is the same as the former embodiments of FIGS. 2 and 3 described above. In addition, the case where the charging and discharging switch 31 is not abnormal and the fuse 32 is abnormal will be described in more detail with reference to FIG. 4.

FIG. 4 is a diagram schematically showing a circuit configuration in a state where the fuse 32 is disconnected, in the battery pack diagnosing apparatus 100 of FIG. 1.

Referring to FIGS. 1 and 4, if the fuse 32 is disconnected in a state where the charging and discharging switch 31 is turned on, seeing the resistor configuration, two resistors R1, R2 may be connected in parallel between the first node N1 and the common node NC. In addition, one resistor RD is present between the common node NC and the ground.

In this configuration, a value of diagnosis voltage may be calculated as in Equation 3 below.

$$VD = \frac{RD}{\frac{R1R2}{(R1+R2)} + RD} VC \quad \text{(Equation 3)}$$

Here, VD refers to a diagnosis voltage, VC refers to a battery cell voltage, R1 refers to a resistance of the first resistor, R2 refers to a resistance of the second resistor, and RD refers to a resistance of the diagnosis resistor, respectively.

As in the former embodiments, assuming that the voltage VC of the battery cell is 400 V, the resistance R1 of the first resistor is 4000 kΩ, the resistance R2 of the second resistor is 3000 kΩ, and the resistance RD of the diagnostic resistor is 10 kΩ, if they are put into Equation 3, the following equation may be obtained.

$$VD = \frac{10}{\frac{4000 \times 3000}{(4000+3000)} + 10} \times 400$$

Thus, VD=2.320 [V] may be calculated, and the reference voltage of the diagnosis voltage in a state where the fuse 32 is disconnected may be set as approximately 2.32V.

At this time, the control unit 160 may compare the reference voltage (2.32V) with the diagnosis voltage measured by the voltage measuring unit 150. If the measured value of the diagnosis voltage is identical or similar to the reference voltage when fuse 32 is disconnected, the control unit 160 may diagnose that charging and discharging switch 31 is turned on but the fuse 32 is disconnected or a current does not flow normally.

Meanwhile, in a situation where a turn-on signal is applied to the charging and discharging switch 31 and thus the charging and discharging switch 31 must be turned on, as in the former embodiment FIG. 3, if the measured value of the diagnosis voltage is measured as a value close to 4.29V, the control unit 160 may determine that the charging and discharging switch 31 and the fuse 32 are operating normally. However, even when the turn-on signal is applied to the charging and discharging switch 31, as in the former embodiment of FIG. 2, if the measured value of the diagnosis voltage is measured as a value close to 1 V, the control unit 160 may determine that the charging and discharging switch 31 does not operate properly.

In this way, in the configuration where the charging and discharging switch 31 and the fuse 32 are included in the charging and discharging switching unit 30, the control unit 160 may simply, quickly and accurately determine which component is abnormal.

Preferably, the battery pack diagnosing apparatus 100 according to the present disclosure may further include a memory unit 170.

The memory unit 170 may store various data or programs required for operating various other components included in the battery pack diagnosing apparatus 100 according to the present disclosure. For example, the memory unit 170 may store data required when the control unit 160 diagnoses whether the charging and discharging switching unit 30 is abnormal. In addition, the control unit 160 may diagnose whether the charging and discharging switching unit 30 is abnormal by accessing the data stored in the memory unit 170 and extracting necessary values.

In particular, the memory unit 170 may store a reference voltage for comparison with the diagnosis voltage measured by the voltage measuring unit 150. Moreover, the memory unit 170 may store the reference voltage to be compared with the diagnosis voltage, and data whether the charging and discharging switch 31 and/or the fuse 32 corresponding thereto are abnormal. This will be described in more detail with reference to FIG. 5.

FIG. 5 is a diagram showing an example of data stored in the memory unit 170, in the battery pack diagnosing apparatus 100 according to an embodiment of the present disclosure.

As shown in FIG. 5, the memory unit 170 may store the reference voltage for comparison with a diagnosis voltage in a table form in advance. Here, the reference voltage may be designated in a range form by dividing the same into several regions. As an example, referring to FIG. 5, if the reference voltage is 3.5V to 4.9V, this may be defined as a first region, if the reference voltage is 1.8V to 3.4V, this may be defined as a second region, and if the reference voltage is 0.5V to 1.7V, this may be defined as a third region.

The memory unit 170 may store whether the charging and discharging switch 31 is normal and/or whether the fuse 32 is normal, for each reference voltage region. In particular, the memory unit 170 may separately store whether the charging and discharging switching unit 30 is normal depending on whether the charging and discharging switch 31 is closed (in a turn-on state) or open (in a turn-off state). For example, as shown in FIG. 5, if the charging and discharging switch 31 corresponds to the first region (3.5 V to 4.9 V) in a situation where the charging and discharging switch 31 must be closed, the memory unit 170 may store data indicating that both the charging and discharging switch 31 and the fuse 32 are normal. Meanwhile, in a situation where the charging and discharging switch 31 must be opened, the memory unit 170 may store data indicating that the charging and discharging switch 31 is abnormal corresponding to the first region (3.5 V to 4.9 V).

Here, in order to determine whether the charging and discharging switching unit 30 is abnormal, the control unit 160 needs to figure out whether the charging and discharging switch 31 must be closed or whether the charging and discharging switch 31 must be opened. The control unit 160 may figure out the closing/opening situation of the charging and discharging switch 31 by sending an opening/closing command to the charging and discharging switch 31, or the corresponding information may be received from another separate component that transmits the opening/closing command to the charging and discharging switch 31.

In addition, the control unit 160 may turn on the diagnosis switching unit SD and receive the diagnosis voltage measurement result from the voltage measuring unit 150. Also, the control unit 160 may determine whether the charging and discharging switch 31 and/or the fuse 32 are abnormal by figuring out a reference voltage region in the table of FIG. 5 to which the received measured value of the diagnosis voltage corresponds.

For example, in a situation where the charging and discharging switch 31 must be turned on (closed), if the diagnosis voltage measured by the voltage measuring unit 150 corresponds to 4.5 V, this corresponds to the first region in the table of FIG. 5, and thus the control unit 160 may determine that both the charging and discharging switch 31 and the fuse 32 are normal. However, in a situation where the charging and discharging switch 31 must be turned on, if the diagnosis voltage measured by the voltage measuring unit 150 is 2.2 V, this corresponds to the second region in the table of FIG. 5, and thus the control unit 160 may determine that the charging and discharging switch 31 is normal but the fuse 32 is abnormal. Alternatively, in a situation where the charging and discharging switch 31 must be turned on, if the diagnosis voltage measured by the voltage measuring unit 150 is 0.9 V, this corresponds to the third region, and thus the control unit 160 may determine that the charging and discharging switch 31 is abnormal. Here, the fact that the charging and discharging switch 31 is normal may mean that the charging and discharging switch 31 is properly turned on in a situation where it must be turned on. Meanwhile, the fact that the charging and discharging switch 31 is abnormal may mean that the charging and discharging switch 31 is not turned on properly and remains open. In addition, the fact that the fuse 32 is abnormal means an abnormal situation such as a situation where a current does not normally flow to the fuse 32 but the fuse 32 is disconnected.

Meanwhile, in a situation where the charging and discharging switch 31 must be turned off (opened), if the diagnosis voltage measured by the voltage measuring unit 150 corresponds to 4.5V, this corresponds to the first region in the table of FIG. 5, and thus the control unit 160 may determine that the charging and discharging switch 31 is abnormal. However, in a situation where the charging and discharging switch 31 must turned off, if the diagnosis voltage measured by the voltage measuring unit 150 is 2.2 V, this corresponds to the second region in the table of FIG. 5, and thus the control unit 160 may determine that both the charging and discharging switch 31 and the fuse 32 are abnormal. Alternatively, in a situation where the charging and discharging switch 31 must be turned off, if the diagnosis voltage measured by the voltage measuring unit 150 is 0.9 V, this corresponds to the third region, and thus that the control unit 160 may determine that the charging and discharging switch 31 is normal. Here, the fact that the charging and discharging switch 31 is normal may mean that the charging and discharging switch 31 is properly opened in a situation where it must to be turned off. Meanwhile, the fact that the charging and discharging switch 31 is abnormal may mean that the charging and discharging switch 31 is not turned off properly but remains closed. In addition, the fact that the fuse 32 is abnormal may mean an abnormal situation such as a situation where a current does not normally flow to the fuse 32 but the fuse 32 is disconnected.

According to this configuration of the present disclosure, as long as the diagnosis voltage is measured, it is possible to quickly and simply check through the table whether the charging and discharging switch 31 or the fuse 32 is abnormal. Moreover, since the control unit 160 does not undergo a complicated calculation process to determine whether the charging and discharging switch 31 or the fuse 32 is abnormal, high performance is not required for the control unit 160, and the calculation process does not require a lot of load.

Meanwhile, in the embodiment of FIG. 5, a configuration in which each situation-specific reference voltage is stored in the form of a table in the memory unit 170 is illustrated, but the present disclosure is not necessarily limited to this form. For example, the memory unit 170 may store a predetermined equation for calculating the reference voltage, such as Equations 1 to 3. In this case, the control unit 160 may determine each situation-specific reference voltage (a reference value or a reference range) using the equation stored in the memory unit 170, for example Equations 1 to 3.

Here, the memory unit 170 may store necessary values in advance so that the reference voltage may be calculated through equations. For example, the memory unit 170 may store battery cell voltage VC, resistances R1, R2, R3, RD of various resistors in advance. In this case, the control unit 160 may calculate the reference voltage by reading cell voltage, resistance, and the like previously stored in the memory unit 170 and putting them into the equation. However, at least some of the factors for calculating the equation, for example, a battery cell voltage, may be a measured value other than a value previously stored. For example, the battery pack may include a component for measuring a battery cell voltage, and the control unit 160 may receive a measured value of the battery cell voltage from the component and input the same as the battery cell voltage VC of Equations 1 to 3.

As described above, when the memory unit 170 stores the equations for calculating the reference voltage, there is no need to store data for each situation individually, and much storage space is not required.

Meanwhile, the memory unit 170 may employ various storage media known at the time of filing of this application. For example, the memory unit 170 may be implemented using a RAM, ROM, a register, a hard disk, an optical recording medium or a magnetic recording medium.

Figure 6:
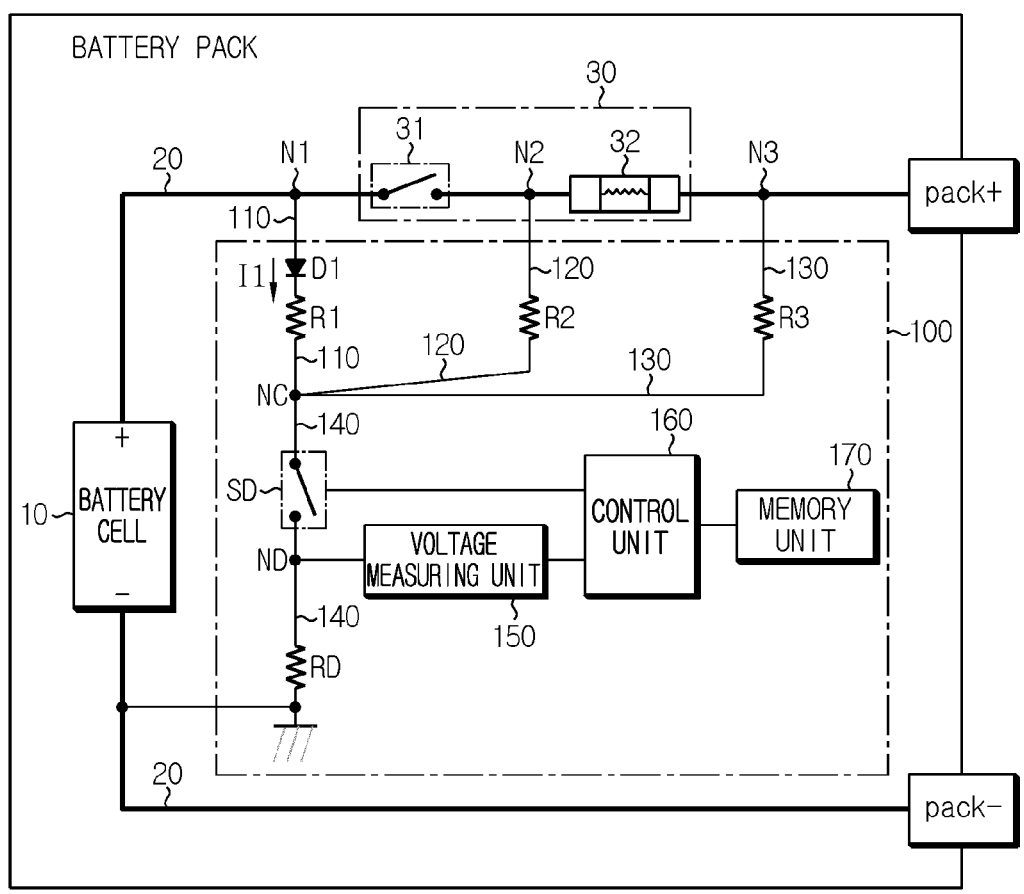
FIG. 6 is a diagram schematically showing a configuration of a battery pack diagnosing apparatus according to another embodiment of the present disclosure.

FIG. 6 is a diagram schematically showing a configuration of a battery pack diagnosing apparatus 100 according to another embodiment of the present disclosure. This embodiment will be described in detail based on features different from the former embodiments, and features similarly applied to the former embodiments will not be described in detail.

Referring to FIG. 6, the battery pack diagnosing apparatus 100 according to the present disclosure may include a diode D1 on the first diagnosing path 110. Here, the diode D1 may be configured to allow a current to flow only toward the common node NC from the charging and discharging path 20. That is, the diode D1 may be configured such that a current flows only from the first node N1 toward the common node NC. Thus, on the first diagnosing path 110, a current may flow only in the direction indicated by an arrow I1.

According to this configuration of the present disclosure, it is possible to prevent an unintentional current from flowing into the battery cell 10 through the first diagnosing path 110. For example, when the charging and discharging switch 31 is opened so that the charging current is not supplied to the battery cell 10 in a state where a charging device is connected to the pack terminal (Pack+, Pack−), the diode D1 may prevent the charging current from flowing into the battery cell 10 via the second diagnosing path 120, the third diagnosing path 130 and the first diagnosing path 110.

Figure 7:
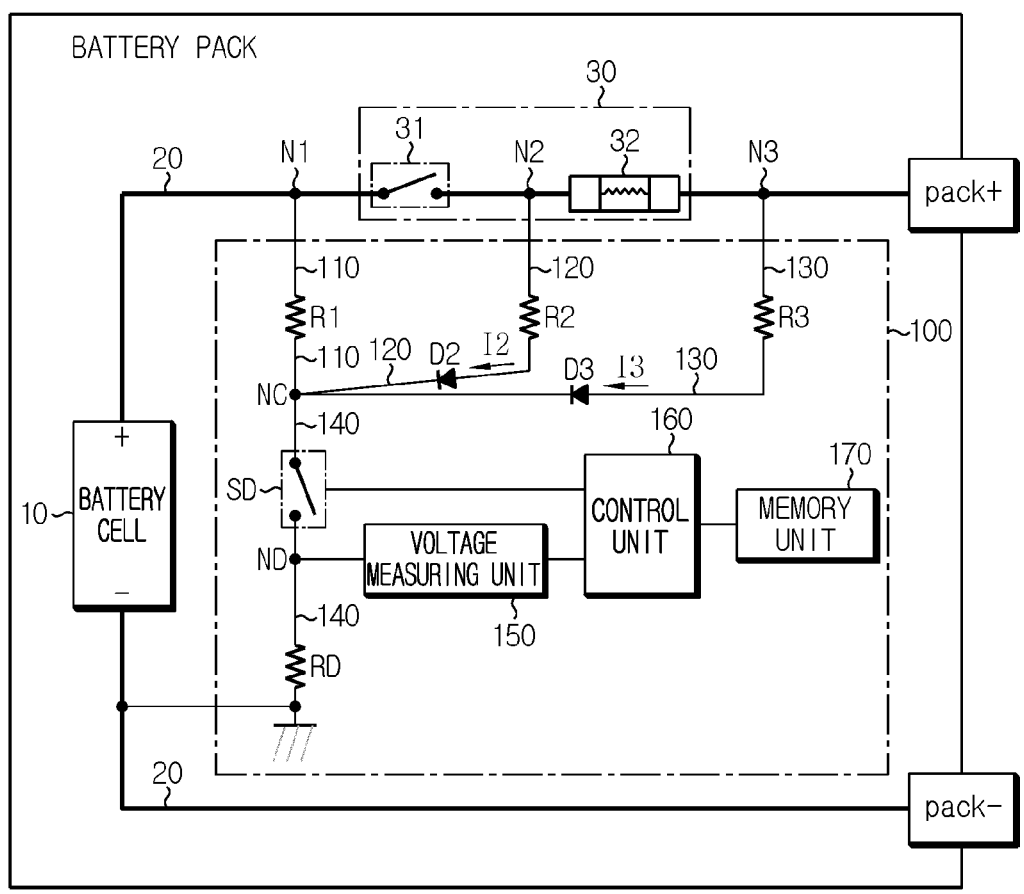
FIG. 7 is a diagram schematically showing a configuration of a battery pack diagnosing apparatus according to still another embodiment of the present disclosure.

FIG. 7 is a diagram schematically showing a configuration of a battery pack diagnosing apparatus 100 according to still another embodiment of the present disclosure. This embodiment will also be described in detail based on features different from the former embodiments.

Referring to FIG. 7, the battery pack diagnosing apparatus 100 according to the present disclosure may include diodes D2, D3 on the second diagnosing path 120 and the third diagnosing path 130. Here, the diodes D2, D3 may be configured to allow a current to flow only toward the common node NC from the charging and discharging path 20. For example, on the second diagnosing path 120, one diode D2 may be configured such that a current flows only from the second node N2 toward the common node NC. In addition, on the third diagnosing path 130, the other diode D3 may be configured such that a current flows only from the third node N3 toward the common node NC. Thus, on the second diagnosing path 120, a current may flow only in the direction indicated by an arrow I2, and on the third diagnosing path 130, a current may flow only in the direction indicated by an arrow I3.

According to this configuration of the present disclosure, it is possible to prevent an unintentional current from flowing from the battery cell 10 to the pack terminal (Pack+, Pack−) through the second diagnosing path 120 and/or the third diagnosing path 130. For example, even though the charging and discharging switch 31 is opened so that the discharging current is not supplied from the battery cell 10 in a state where a load is connected to the pack terminal, it is possible to prevent the discharging current from flowing out from the battery cell 10 to a load outside the pack terminal (Pack+, Pack−) via the first diagnosing path 110, the second diagnosing path 120 and/or the third diagnosing path 130.

Figure 8:
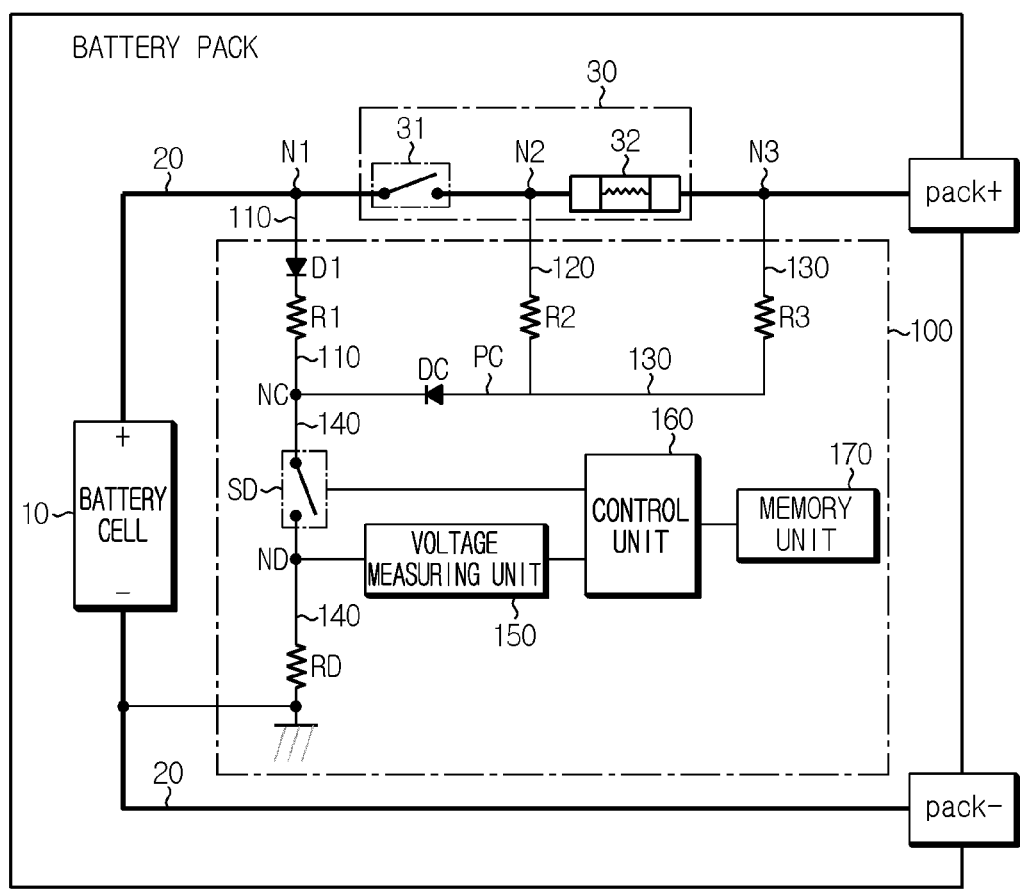
FIG. 8 is a diagram schematically showing a configuration of a battery pack diagnosing apparatus according to still another embodiment of the present disclosure.

FIG. 8 is a diagram schematically showing a configuration of a battery pack diagnosing apparatus 100 according to still another embodiment of the present disclosure. This embodiment will also be described in detail based on features different from the former embodiments.

Referring to FIG. 8, the second diagnosing path 120 and the third diagnosing path 130 may be partially integrated into one path. In particular, the second diagnosing path 120 and the third diagnosing path 130 may be configured such that at least a part of the path between the second resistor R2 and the common node NC and the path between the third resistor R3 and the common node NC are integrated into one path. For example, as indicated by PC in FIG. 8, a part of the path between the second resistor R2 and the common node NC on the second diagnosing path 120 and a part of the path between the third resistor R3 and the common node NC on the third diagnosing path 130 may be integrated into one path to form a common path.

Here, on the common path PC of the second diagnosing path 120 and the third diagnosing path 130, one diode DC may be provided. For example, as shown in FIG. 8, one diode DC may be provided on the common path PC, and no separate diode may be provided to the second diagnosing path 120 or the third diagnosing path 130.

According to this configuration of the present disclosure, an unintentional discharging current may be prevented from flowing to the second diagnosing path 120 and/or the third diagnosing path 130 even with a small number of diodes. In this case, the circuit configuration of the battery pack diagnosing apparatus 100 is more simplified, manufacturing cost and time are reduced, and product efficiency may be improved.

Meanwhile, as shown in FIGS. 6 to 8, when a diode is included in the battery pack diagnosing apparatus 100, the reference voltage may be set to reflect the voltage drop effect of the diode. An example of this will be described with reference to FIG. 9.

Figure 9:
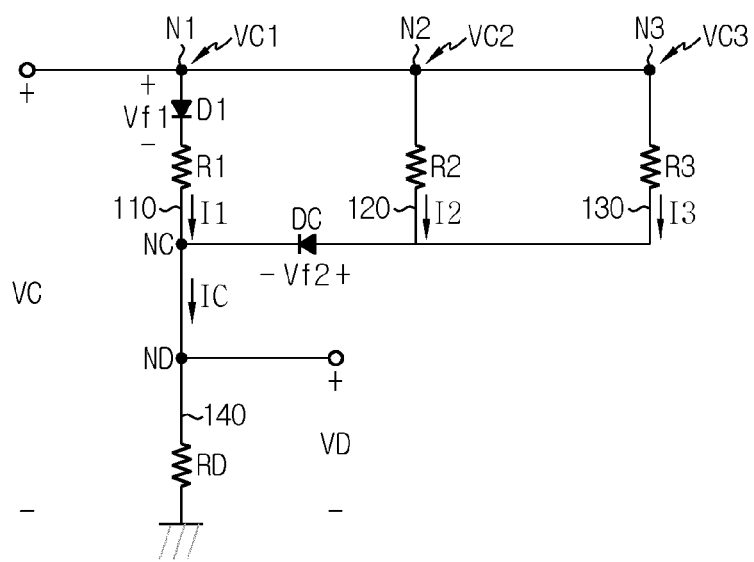
FIG. 9 is a diagram schematically showing a circuit configuration in a state where the charging and discharging switch is normally turned on, in the battery pack diagnosing apparatus of FIG. 8.

FIG. 9 is a diagram schematically showing a circuit configuration in a state where the charging and discharging switch 31 is normally turned on, in the battery pack diagnosing apparatus 100 of FIG. 8.

FIGS. 8 and 9 may be regarded as showing a circuit configuration when the charging and discharging switch 31 is turned on normally and the diagnosis switching unit SD is turned on in a state where a separate charging and discharging device is not connected to the pack terminal (Pack+, Pack−) of the battery pack. At this time, assuming that the current flowing through the first diagnosing path 110 is I1, the current flowing through the second diagnosing path 120 is I2, the current flowing through the third diagnosing path 130 is I3 and the current flowing through the integrated diagnosing path 140 is IC, the relationship as in Equation 4 below is established between the currents.

$$IC = I1 + I2 + I3 \qquad \text{(Equation 4)}$$

Here, assuming that the voltage of the first node N1 is VC1, the voltage of the second node N2 is VC2, the voltage of the third node N3 is VC3, the diagnosis voltage is VD, the voltage drop caused by the diode D1 is Vf1 and the voltage drop caused by the diode DC is Vf2, each current may be calculated as follows.

$$I1=(VC1-Vf1-VD)/R1$$

$$I2=(VC2-Vf2-VD)/R2$$

$$I3=(VC3-Vf2-VD)/R3$$

$$IC=VD/RD$$

If the equation of each current is put into Equation 4, Equation 5 below may be derived.

$$VD = \frac{\left(\frac{VC1-Vf1}{R1} + \frac{VC2-Vf2}{R2} + \frac{VC3-Vf2}{R3}\right)}{\left(\frac{1}{R1} + \frac{1}{R2} + \frac{1}{R3} + \frac{1}{RD}\right)} \quad \text{(Equation 5)}$$

Here, VC1, VC2, VC3, Vf1 and Vf2 may be known values. In particular, if the charging and discharging switch 31 is normally turned on and the fuse 32 is also in a state where a current may normally flow, VC1, VC2 and VC3 are all equal to VC that is the voltage of the battery cell 10. Thus, control unit 160 may calculate the reference voltage when the charging and discharging switch 31 and the fuse 32 are in a normal state by putting known VC values as VC1, VC2 and VC3 in Equation 5 and also putting known Vf1 and Vf2 values. Alternatively, the memory unit 170 may store the reference voltage calculated according to Equation 5 in advance, and the control unit 160 may determine whether the charging and discharging switch 31 and the fuse 32 normally operate by using the reference voltage stored in the memory unit 170 in advance.

If the charging and discharging switch 31 is normal but the fuse 32 is disconnected, I3 becomes 0. Thus, in Equation 5, the reference values VD of the diagnosis voltage may be derived in a state where the parts '1/R3' and '(VC3-Vf2)/R3' in which R3 is a denominator are deleted.

In addition, if both the charging and discharging switch 31 and the fuse 32 are abnormal, both I2 and I3 become 0. Thus, in Equation 5, the reference value VD of the diagnosis voltage may be derived in a state where the parts '1/R2', '(VC2-Vf2)/R2', '1/R3', and '(VC3-Vf2)/R3' in which R2 and R3 are denominators are all deleted.

Meanwhile, the first resistor R1, the second resistor R2, the third resistor R3 and the diagnosis resistor RD may have various values according to various situations, such as the specifications of the battery pack or the specifications of the battery pack diagnosing apparatus 100, and the present disclosure is not limited by the specific resistance of each resistor. For example, the resistances of the first resistor R1, the second resistor R2, the third resistor R3 and/or the diagnosis resistor RD may be appropriately determined according to the voltage of the battery cell 10.

Preferably, at least two resistors among the first resistor R1, the second resistor R2 and the third resistor R3 may be configured to have different resistances. In particular, the first resistor R1 may be configured to have a greater resistance compared to the second resistor R2 or the third resistor R3. That is, in the battery pack diagnosing apparatus 100 according to the present disclosure, when comparing resistances among the first resistor R1, the second resistor R2 and the third resistor R3, the following relationship may be established.

$$R1 > R2 \text{ or } R1 > R3.$$

According to this configuration of the present disclosure, the difference between the reference voltage when the charging and discharging switch 31 and the fuse 32 are in a normal state and the reference voltage when the charging and discharging switch 31 and/or fuse 32 is in an abnormal state may be increased. Thus, in this case, when the diagnosis voltage measurement result by the voltage measuring unit 150 is compared with the reference voltage, it may be more reliably determined whether the charging and discharging switch 31 and/or the fuse 32 are abnormal.

Moreover, the first resistor R1 may be configured to have a greater resistance than the second resistor R2 and the third resistor R3. Also, in this case, the second resistor may be configured to have a greater resistance than the third resistor. That is, in the battery pack diagnosing apparatus 100 according to the present disclosure, when comparing resistances among the first resistor R1, the second resistor R2 and the third resistor R3, the following relationship may be established.

$$R1 > R2 > R3.$$

According to this configuration of the present disclosure, the difference between when the charging and discharging switching unit 30 is in a normal state and when it is in an abnormal state becomes more clear, and thus it may be more clearly diagnosed whether the charging and discharging switching unit 30 is abnormal.

The effects obtained by setting resistances of various resistors will be described in more detail with reference to FIG. 10.

FIG. 10 is a table schematically showing the change in difference between reference voltages of each situation according to the change of resistance magnitude of various resistors, for the battery pack diagnosing apparatus 100 of FIG. 8. In FIG. 10, the charging and discharging switch 31 is referred to as a contactor.

The situation-specific reference voltage of FIG. 10 relates to a situation where the contactor must be turned on, and this may be calculated using Equation 5. At this time, the voltage VC of the battery cell 10 is input as 400 V, the diagnosis resistor RD is input as 10 kΩ, the voltage drop Vf1 caused by the diode D1 of the first diagnosing path 110 is input as 0.7 V, and the voltage drop Vf2 caused by the diode DC provided to the common path of the second diagnosing path 120 and the third diagnosing path 130 is input as 0.7V.

In the 'SITUATION-SPECIFIC REFERENCE VOLTAGE' of FIG. 10, 'NORMAL' refers to a reference voltage when both the contactor 31 and the fuse 32 are in a normal state, 'FUSE ABNORMAL' refers to a reference voltage when the contactor is not abnormal but the fuse 32 is abnormal, and 'CONTACTOR ABNORMAL' refers to a reference voltage when the contactor is not properly turned on.

In addition, 'DIFFERENCE BETWEEN REFERENCE VOLTAGES' of FIG. 10 refers to an absolute value for the difference between the situation-specific reference voltages. For example, 'NORMAL-FUSE ABNORMAL' refers to a value obtained by subtracting the reference voltage of the 'FUSE ABNORMAL' column from the reference voltage of the 'NORMAL' column. In addition, 'NORMAL-CONTACTOR ABNORMAL' refers to a value obtained by subtracting the reference voltage of the 'CONTACTOR ABNORMAL' column from the reference voltage of the 'NORMAL' column. Also, 'FUSE ABNORMAL-CONTACTOR ABNORMAL' refers to a value obtained by subtracting the reference voltage of the 'CONTACTOR ABNORMAL' column from the reference voltage of the 'FUSE ABNORMAL' column.

First, looking at the results of Nos. 1 to 9, it may be found that in the examples Nos. 1 and 7 where the resistance of the first resistor R1 is greater than the resistance of the second resistor R2 and the resistance of the third resistor R3, the differences between the reference voltages are all greater compared to the other embodiments. In particular, in the examples other than the examples Nos. 1 and 7, the differences between the reference voltages of the 'NORMAL-CONTACTOR ABNORMAL' column are just 1.99 V to 2.98 V, whereas in the examples Nos. 1 and 7, the differences between the reference voltages of the 'NORMAL-CONTACTOR ABNORMAL' column are calculated higher as 3.31 V. Thus, it may be understood that, if the resistance of the first resistor R1 is greater than the resistance of the second resistor R2 and the resistance of the third resistor R3 as in the example Nos. 1 and 7, the diagnosis is performed more easily by distinguishing the normal state and the contactor abnormal state from each other.

Moreover, in the example No. 1, it is found that the difference between the reference voltages in the 'NORMAL-FUSE ABNORMAL' column is significantly higher than the other examples including the example No. 7. That is, in the example No. 1, the difference between the reference voltages in the 'NORMAL-FUSE ABNORMAL' column is 1.98 V, while the other examples show differences between the reference voltages of 0.99 V to 1.33 V, which are significantly lower. Thus, in the example No. 1 where the first resistor R1, the second resistor R2 and the third resistor R3 are all different resistances so that the first resistor has a greatest resistance, the second resistor has a middle resistance and the third resistor has a lowest resistance, it may be understood that the normal state and the abnormal state (at least one of the contactor and the fuse is broken) are more clearly distinguished.

This pattern may also be found even in the calculation results of the example Nos. 10 to 13 where the resistances are entirely differently set from the examples Nos. 1 to 9. That is, in the example Nos. 10 and 13 where the resistance of the first resistor is greater than the resistances of the second resistor and the third resistor, the differences between the reference voltages of the 'NORMAL-CONTACTOR ABNORMAL' column are significantly greater than those of the example Nos. 11 and 12. Moreover, in the example No. 10 where the resistance of the second resistor is greater than the resistance of the third resistor, the difference between the reference voltages in the 'NORMAL-FUSE ABNORMAL' column is shown greater, compared to the example No. 13 where the resistance of the second resistor is smaller than the resistance of the third resistor. Thus, even from these results, it may be understood that an abnormal situation may be more easily diagnosed when the second resistor has a smaller resistance than the first resistor and a greater resistance than the third resistor, since the gap between the reference voltage at a normal state and the reference voltage at an abnormal state is widened.

The diagnosis resistor RD may be configured to have a smaller resistance than the first resistor R1, the second resistor R2 and the third resistor R3. For example, when the resistance of the first resistor R1 is 4000 kΩ, the resistance of the second resistor R2 is 3000 kΩ and the resistance of the third resistor R3 is 2000 kΩ, the resistance of the diagnosis resistor RD may be 10 kΩ.

According to this configuration of the present disclosure, since the both-terminal voltage of the diagnosis resistor RD is small, the voltage measuring unit 150 may not be overloaded and high performance may not be required for the voltage measuring unit 150. Also, in this case, even though a charging current or a discharging current is unintentionally introduced into the common node NC due to a charging device or a discharging device connected to the pack terminal (Pack+, Pack−), the current may be allowed to flow to the ground through the integrated diagnosing path 140 and be prevented from flowing to the first diagnosing path 110, or to the second diagnosing path 120 and the third diagnosing path 130.

Meanwhile, in various embodiments described above, it has been described that the charging and discharging switch 31 is located closer to the battery cell 10 than the fuse 32, but the present disclosure is not limited to this type of the charging and discharging switching unit 30. For example, the charging and discharging switching unit 30 of the battery pack may also be configured as shown in FIG. 11.

Figure 11:
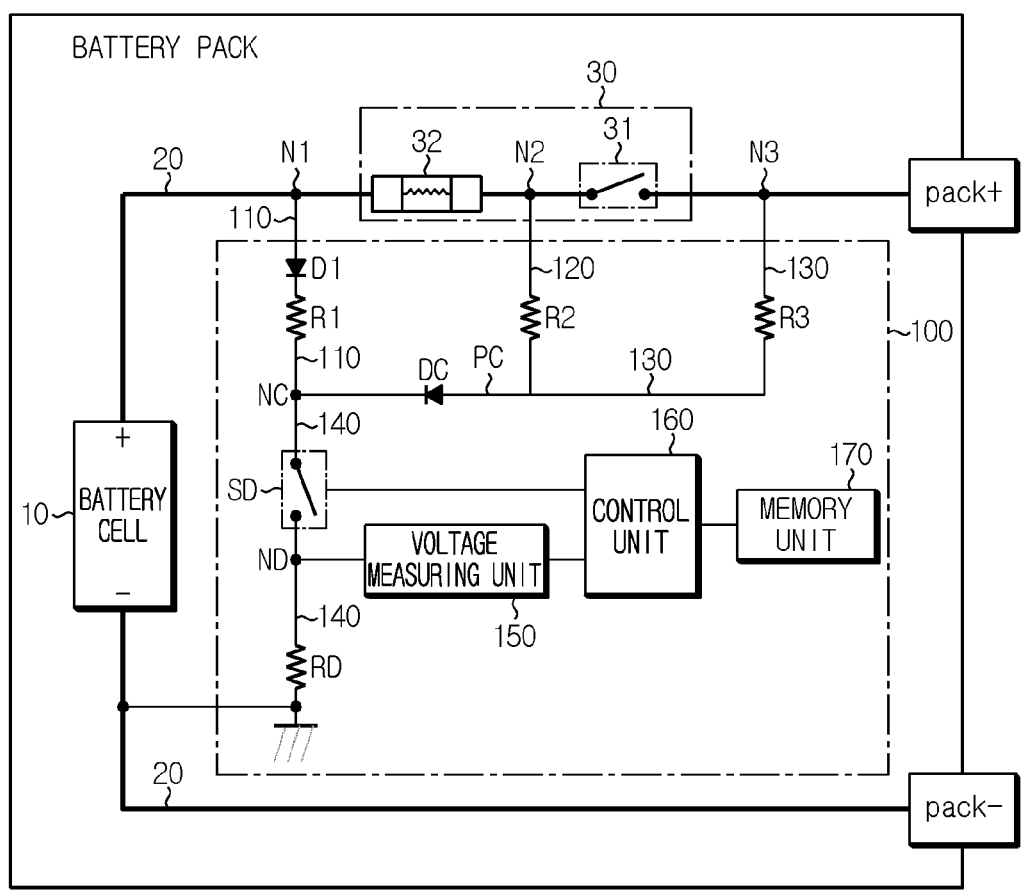
FIG. 11 is a diagram schematically showing a configuration of a battery pack diagnosing apparatus according to still another embodiment of the present disclosure.

FIG. 11 is a diagram schematically showing a configuration of a battery pack diagnosing apparatus 100 according to still another embodiment of the present disclosure. This embodiment will also be described in detail based on features different from the former embodiments.

Referring to FIG. 11, different from the configurations of FIGS. 1, 6 to 8, the charging and discharging switching unit 30 of the battery pack may be configured such that the fuse 32 is located closer to the battery cell 10 than the charging and discharging switch 31. In this configuration, the method of calculating a reference voltage may be applied similarly, but the situation for the calculated reference voltage may be differently applied.

For example, if the fuse 32 and the charging and discharging switch 31 are in a normal state, the reference voltage may be determined in the same way as in the embodiment of FIG. 8. However, in the embodiment of FIG. 11, when the charging and discharging switch 31 is abnormal, the reference voltage may be derived identical or similar to the reference voltage when the fuse 32 is abnormal in the embodiment of FIG. 8. In addition, in the embodiment of FIG. 11, the reference voltage when the fuse 32 is abnormal may be derived identical or similar to the reference voltage when the charging and discharging switch 31 is abnormal in the embodiment of FIG. 8.

Meanwhile, in the configuration of FIG. 11, similar to the embodiment of FIG. 8, it is shown that one diode D1 is provided to the first diagnosing path 110 and the other diode DC is provided to the common path PC of the second diagnosing path 120 and the third diagnosing path 130. However, the embodiment of the present disclosure is not limited to this form but may be implemented in various ways where some diodes and the common path are not present, as in FIGS. 1, 6 and 7.

The battery pack according to the present disclosure may include the battery pack diagnosing apparatus 100 according to the present disclosure as described above. In particular, in the battery pack according to the present disclosure, the control unit 160 of the battery pack diagnosing apparatus 100 may be implemented using a BMS. In addition, the battery pack according to the present disclosure may include a battery cell having a plurality of secondary batteries, electronic components (including a BMS, a relay, a fuse, or the like) and a pack case, in addition to the battery pack diagnosing apparatus 100.

In addition, the battery pack diagnosing apparatus 100 according to the present disclosure may be mounted to a vehicle, particularly an electric vehicle. That is, the vehicle according to the present disclosure may include the battery pack diagnosing apparatus 100 according to the present disclosure. Here, the battery pack diagnosing apparatus 100 may be included in the battery pack but may also be implemented as a device separate from the battery pack. For example, the control unit 160 of the battery pack diagnosing apparatus may be implemented using an ECU of the vehicle. In addition, the vehicle according to the present disclosure may include a vehicle body or electronic components that are typically provided to the vehicle, in addition to the battery pack diagnosing apparatus 100. For example, the vehicle according to the present disclosure may include a battery cell 10, a contactor, an inverter, a motor, at least one ECU and the like, in addition to the battery pack diagnosing apparatus 100 according to the present disclosure. However, the present disclosure is not particularly limited in relation to components of the vehicle other than the battery pack diagnosing apparatus 100.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

10: battery cell
20: charging and discharging path
30: charging and discharging switching unit
31: charging and discharging switch,
32: fuse
Pack+, Pack−: pack terminal
100: battery pack diagnosing apparatus
110: first diagnosing path
120: second diagnosing path
130: third diagnosing path
140: integrated diagnosing path
150: voltage measuring unit
160: control unit
170: memory unit
SD: diagnosis switching unit
R1: first resistor,
R2: second resistor,
R3: third resistor,
RD: diagnosis resistor
N1: first node,
N2: second node,
N3: third node,
NC: common node,
ND: diagnosis node

What is claimed is:

1. A battery pack diagnosing apparatus for diagnosing a battery pack in which a charging and discharging path connects a battery cell to a pack terminal, wherein each of a (i) charging and discharging switch and (ii) a fuse is positioned on the charging and discharging path in series between the battery cell and the pack terminal, wherein the charging and discharging switch is positioned between the battery cell and the fuse, and wherein the fuse is positioned between the charging and discharging switch and the pack terminal, the battery pack diagnosing apparatus comprising:
  a first diagnosing path having a first end connected to a first node positioned on the charging and discharging path between the battery cell and the charging and discharging switch and a second end connected to a common node on a path toward ground;
  a first resistor positioned on the first diagnosing path between the first node and the common node;
  a second diagnosing path having a first end connected to a second node positioned on the charging and discharging path between the charging and discharging switch and the fuse and a second end connected to the common node;
  a second resistor positioned on the second diagnosing path between the second node and the common node;
  a third diagnosing path having a first end connected to a third node positioned on the charging and discharging path between the charging and discharging switch and the pack terminal and a second end connected to the common node;
  a third resistor positioned on the third diagnosing path between the third node and the common node;
  an integrated diagnosing path having a first end connected to the common node and a second end connected to ground;
  a diagnosis switching unit and a diagnosis resistor positioned on the integrated diagnosing path in series between the first common node and ground;
  a voltage measuring unit configured to measure a diagnosis voltage at a diagnosis node on the integrated diagnosis path between the diagnosis switching unit and the diagnosis resistor; and
  a control unit configured to turn on and off the diagnosis switching unit and determine whether the charging and discharging switch is operating abnormally based on the diagnosis voltage measured by the voltage measuring unit.

2. The battery pack diagnosing apparatus according to claim 1,
  wherein no switching element is positioned on any one of the first diagnosing path, the second diagnosing path and the third diagnosing path.

3. The battery pack diagnosing apparatus according to claim 1,
  wherein the control unit is configured to determine which of the charging and discharging switch and the fuse is operating abnormally.

4. The battery pack diagnosing apparatus according to claim 1, further comprising:
  a memory unit configured to store a reference voltage for comparison with the measured diagnosis voltage.

5. The battery pack diagnosing apparatus according to claim 1, further comprising a diode positioned on the first diagnosing path and configured to allow current to flow from the first node toward the common node and restrict current from flowing from the common node toward the first node.

6. The battery pack diagnosing apparatus according to claim 1, further comprising:
  a first diode positioned on the second diagnosing path and configured to allow current to flow from the second node toward the common node and restrict current from flowing from the common node toward the second node, and
  a second diode positioned on the third diagnosing path and configured to allow current to flow from the third node toward the common node and restrict current from flowing from the common node toward the third node.

7. The battery pack diagnosing apparatus according to claim 1,
  wherein the second diagnosing path and the third diagnosing path partially overlap along a portion of the second diagnosing path between the second resistor and the common node and a portion of the third diagnosing path between the third resistor and the common node, the apparatus further comprising a diode positioned on the common path and configured to allow current to flow from the second and third nodes toward the common node and restrict current from flowing from the common node toward the second and third nodes.

8. The battery pack diagnosing apparatus according to claim 1,
wherein at least two resistors among the first resistor, the second resistor and the third resistor have different resistances.

9. A battery pack, comprising the battery pack diagnosing apparatus according to claim 1.

10. A vehicle, comprising the battery pack diagnosing apparatus according to claim 1.

11. A method for diagnosing a battery pack in which a charging and discharging path connects a battery cell to a pack terminal, wherein each of a (i) charging and discharging switch and (ii) a fuse is positioned on the charging and discharging path in series between the battery cell and the pack terminal, wherein the charging and discharging switch is positioned between the battery cell and the fuse, and wherein the fuse is positioned between the charging and discharging switch and the pack terminal, the method comprising:
measuring, by a voltage measuring unit, a diagnosis voltage at a diagnosis node of an integrated diagnosis path having a first end connected to the common node and a second end connected to ground, wherein a diagnosis switching unit and a diagnosis resistor are positioned on the integrated diagnosing path in series, wherein the diagnosis node is positioned between the diagnosis switching unit and the diagnosis resistor, wherein the common node is connected to each of (i) a first node positioned on the charging and discharging path between the battery cell and the charging and discharging switching unit via a first diagnosing path, (ii) a second node positioned on the charging and discharging path between the charging and discharging switch and the fuse via a second diagnosing path, and (iii) a third node positioned on the charging and discharging path between the charging and discharging switch and the pack terminal via a third diagnosing path, wherein a first resistor is positioned on the first diagnosing path between the first node and the common node, wherein a second resistor is positioned on the second diagnosing path between the second node and the common node, and wherein a third resistor is positioned on the third diagnosing path between the third node and the common node; and
determining, by a control unit configured to turn the diagnosis switching unit on and off, whether the charging and discharging switch is operating abnormally based on the diagnosis voltage measured by the voltage measuring unit.

12. The method according to claim 11,
wherein determining whether the charging and discharging switching unit is operating abnormally includes determining which of the charging and discharging switch and the fuse is operating abnormally.

13. The method according to claim 11, further comprising:
comparing, by the control unit, the measured diagnosis voltage with a reference voltage stored in a memory unit, wherein determining whether the charging and discharging switch is operating abnormally is based on comparison of the measured diagnosis voltage with the reference voltage.

14. The method according to claim 11,
wherein the first diagnosing path has a diode allowing current to flow from the first node toward the common node and restricting current from flowing from the common node toward the first node.

15. The method according to claim 11,
wherein a first diode is positioned on the second diagnosing path to allow current to flow from the second node toward the common node and restricting current from flowing from the common node toward the second node, and
wherein a second diode is positioned on the third diagnosing path to allow current to flow from the third node toward the common node and restricting current from flowing from the common node toward the third node.

16. The method according to claim 11,
wherein the second diagnosing path and the third diagnosing path partially overlap along a portion of the second diagnosing path between the second resistor and the common node and a portion of the third diagnosing path between the third resistor and the common node, and a diode is positioned on the common path to allow current to flow from the second and third nodes toward the common node and restrict current from flowing from the common node toward the second and third nodes.

17. The method according to claim 11,
wherein at least two resistors among the first resistor, the second resistor and the third resistor have different resistances.

* * * * *